(12) United States Patent
Cheng et al.

(10) Patent No.: US 9,293,576 B2
(45) Date of Patent: Mar. 22, 2016

(54) SEMICONDUCTOR DEVICE WITH LOW-K GATE CAP AND SELF-ALIGNED CONTACT

(71) Applicant: INTERNATIONAL BUSINESS MACHINES CORPORATION, Armonk, NY (US)

(72) Inventors: Kangguo Cheng, Schenectady, NY (US); Ali Khakifirooz, Los Altos, CA (US); Alexander Reznicek, Troy, NY (US); Charan V. V. S. Surisetty, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/197,649

(22) Filed: Mar. 5, 2014

(65) Prior Publication Data

US 2015/0255556 A1    Sep. 10, 2015

(51) Int. Cl.
*H01L 29/78* (2006.01)
*H01L 29/66* (2006.01)

(52) U.S. Cl.
CPC ........ *H01L 29/7813* (2013.01); *H01L 29/6659* (2013.01); *H01L 29/66545* (2013.01)

(58) Field of Classification Search
USPC ......................................................... 438/299
See application file for complete search history.

(56) References Cited

U.S. PATENT DOCUMENTS

| 6,316,349 | B1 | 11/2001 | Kim et al. |
|---|---|---|---|
| 6,423,645 | B1 | 7/2002 | Wei et al. |
| 6,562,714 | B1 | 5/2003 | Lee |
| 7,001,817 | B2 | 2/2006 | Yeo et al. |
| 7,271,049 | B2 | 9/2007 | Gluschenkov et al. |
| 8,373,239 | B2 | 2/2013 | Siddiqui et al. |
| 2011/0156107 | A1* | 6/2011 | Bohr ................ H01L 21/76831 257/288 |
| 2012/0184079 | A1 | 7/2012 | Kim et al. |
| 2012/0299101 | A1 | 11/2012 | Babich et al. |
| 2015/0021683 | A1* | 1/2015 | Xie et al. .................. 257/330 |

FOREIGN PATENT DOCUMENTS

| KR | 1020010045126 A | 6/2001 |
|---|---|---|
| KR | 1020050024977 A | 3/2005 |

OTHER PUBLICATIONS

"A 22nm high performance and low-power CMOS technology featuring fully-depleted tri-gate transistors, self-aligned contacts and high density MIM capacitors", Auth et al.

* cited by examiner

*Primary Examiner* — Shaun Campbell
*Assistant Examiner* — Aneta Cieslewicz
(74) *Attorney, Agent, or Firm* — Matthew C. Zehrer

(57) ABSTRACT

A semiconductor device includes at least a gate formed upon a semiconductor substrate, a contact trench self aligned to the gate, and a multilayered gate caps comprising a first gate cap formed upon each gate and a low-k gate cap formed upon the first gate cap. The multilayered gate cap may electrically isolate the gate from a self aligned contact formed by filling the contact trench with electrically conductive material. The multilayered gate cap reduces parasitic capacitance formed between the source-drain region, gate, and multilayered gate cap that may adversely impact device performance and device power consumption.

5 Claims, 9 Drawing Sheets

SEMICONDUCTOR DEVICE WITH LOW-K GATE CAP AND SELF-ALIGNED CONTACT

FIELD

Embodiments of invention generally relate to semiconductor devices, design structures for designing a semiconductor device, and semiconductor device fabrication methods. More particularly, embodiments relate to semiconductor devices with a low-k gate cap and a self-aligned contact.

BACKGROUND

Currently there is difficulty in maintaining semiconductor device performance improvements in devices of deeply submicron generations. To maintain such improvements, the use of a self-aligned contact (SAC) may be inevitable for semiconductor devices of 14 nm nodes and beyond due to increasingly scaled gate pitches. The use of a SAC typically requires an insulator cap to electrically isolate the SAC from the gate conductor. As such, parasitic capacitance is formed by the gate conductor, the insulator cap, and the SAC. This parasitic capacitance may adversely impact device performance and power consumption. However, conventional gate caps utilized to reduce this parasitic capacitance may have poor etch selectivity to, for example, oxide and nitride which are widely used in device fabrication. Thus, direct usage of these conventional gate caps introduces fabrication problems. Therefore, there is a need to improve semiconductor device SAC fabrication process and structures.

SUMMARY

In an embodiment of the present invention, a semiconductor device includes at least one gate formed upon a semiconductor substrate, a contact trench self-aligned to the gate, and a multilayered gate cap. The multilayered gate cap may include a first gate cap formed upon the gate and a low-k gate cap formed upon the first gate cap. In certain embodiments, the multilayered gate cap reduces parasitic capacitance formed between the gate and electrically conductive material formed within the contact trench that may adversely impact device performance and device power consumption.

In an embodiment of the present invention, a semiconductor device fabrication process includes forming at least one gate upon a semiconductor substrate, forming a first gate cap upon the gate, forming a contact trench self aligned to the gate, and subsequent to forming the self aligned contact trench, forming a low-k gate cap upon the first gate cap.

In another embodiment, a design structure tangibly embodied in a machine readable medium for designing, manufacturing, or testing a semiconductor device, includes the semiconductor device includes at least one gate formed upon a semiconductor substrate, the contact trench self-aligned to the gate, and the multilayered gate cap.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Figure 1:
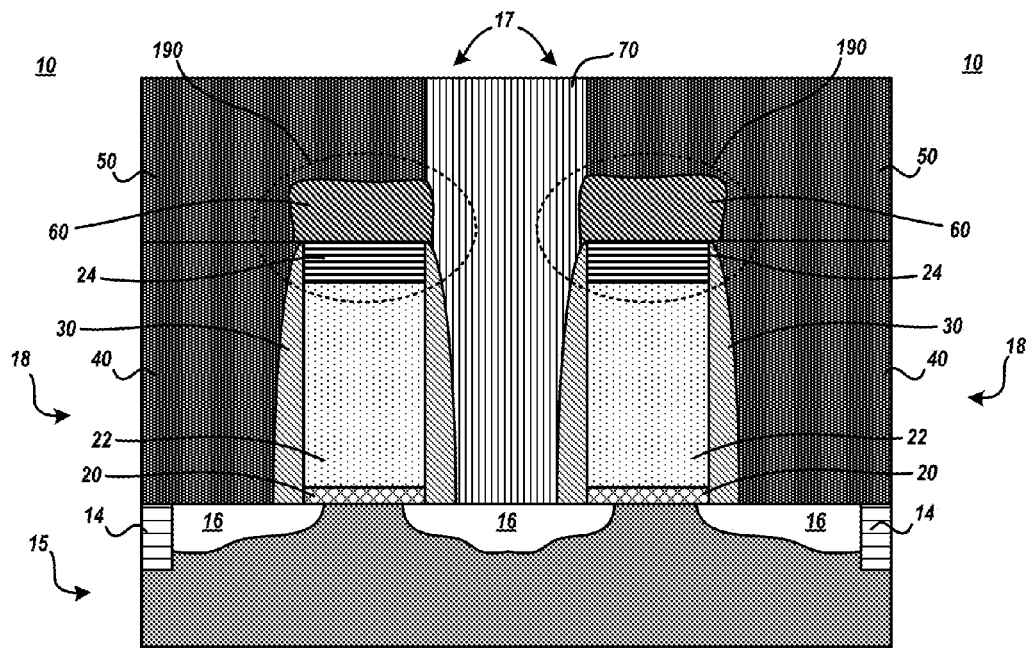
FIG. 1-FIG. 14 depict cross section views of a semiconductor structure at intermediate stages of semiconductor device fabrication, in accordance with various embodiments of the present invention.

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to semiconductor devices, and more particularly to semiconductor structures utilizing a gate. For example, the semiconductor device may be a planar device having planar electrodes in parallel planes, made by alternate diffusion of p- and n-type impurities into a substrate. In another example, the semiconductor device may be a FinFET device and may include a plurality of fins formed in a wafer and a gate covering a portion of the fins. The portion of the fins covered by the gate may serve as a channel region of the device. Portions of the fins may also extend out from under the gate and may serve as source and drain regions of the device. Semiconductor structures including FinFETs may be implemented with gate first or gate last FinFET fabrication process techniques. In gate first processes, metal layers over first structure areas (e.g. NMOS areas, etc.) and second structure areas (e.g. PMOS areas, etc.) are formed and patterned to form gate structures followed by typical CMOS processing such as forming of the source and drain, forming spacers and depositing of the interlevel dielectric. In a gate last process, a dummy gate structure is formed followed by typical CMOS processing including formation of the source and drain, formation of spacers and deposition of the interlevel dielectric. Thereafter, the dummy gate structure is removed followed by deposition of a replacement gate structure.

Referring now to the figures, wherein like components are labeled with like numerals, exemplary fabrication steps of forming a semiconductor structure 10 in accordance with embodiments of the present invention are shown, and will now be described in greater detail below. It should be noted that some of the figures depict various cross section views of structure 10 the orientation of which is depicted in a view plane perpendicular to a gate 17. Furthermore, it should be noted that while this description may refer to some components of the structure 10 in the singular tense, more than one component may be depicted throughout the figures. However, it is noted that specific elements may be denoted by a numeral and a subscript (e.g. 15a, etc.). When those elements are referred to generically, merely the numeral is used (e.g. 15, etc.). The specific number of components depicted in the figures and the cross section orientation was chosen to best illustrate the various embodiments described herein.

FIG. 1 depicts a cross section view of semiconductor structure 10 at an intermediate stage of semiconductor device fabrication, in accordance with various embodiments of the present invention. At this stage of fabrication semiconductor structure 10 includes a number of components or regions that are overlying or embedded in a semiconductor substrate 15. Structure 10 may include isolation regions 14 and source/drain (S/D) regions 16. S/D regions 16 may lie next to a self aligned contact (SAC) gate 17 including a first gate 18 and second gate 18. Gates 18 may include a number of materials, such as a dielectric 20 (e.g., silicon oxide, silicon nitride, silicon oxynitride, high-k dielectric material, or any suitable combination of those materials.) overlying the substrate 15, a gate conductor 22 (e.g. doped polysilicon, metal, conducting metallic compound, or any suitable of those materials) overlying dielectric layer 20 and an insulator cap 24 (e.g., nitride) overlying the gate conductor 22. Surrounding the gates 18 may be spacers 30. Dielectric 20 and insulator cap 24 may protect the other materials of the gates 18 from undesired contacts and shorts. Semiconductor structure 10 may also include a first inter-layer dielectric (ILD) layer 40 (e.g., oxide) formed upon substrate 15 and a second ILD layer 50 formed upon ILD 40. Structure 10 may also include low-k gate cap 60 formed upon insulator cap 24 and a SAC 70 self aligned to SAC gate 17. The following FIGS. 2-14 illustrate exemplary fabrication techniques for forming semiconductor structure 10 comprising for example one low-k gate cap 60 and a SAC 70.

Figure 2:
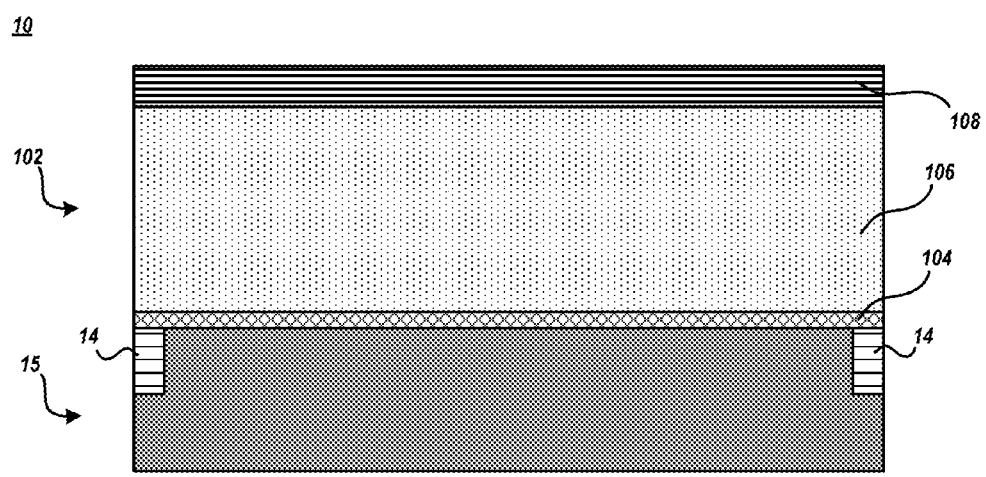

FIG. 2 depicts a cross section view of semiconductor structure 10 as initial structure for use in one embodiment of the present invention. The initial structure 10 may include a layered gate stack 102 overlying the semiconductor substrate 15. The layered gate stack 102 may include a gate dielectric layer 104 overlying the semiconductor substrate 15. In various embodiments, gate dielectric layer 104 may be, for example, a silicon oxide, a silicon oxynitride, silicon oxynitride, high-k dielectric, or any suitable combination of those materials. In one embodiment, the gate dielectric layer 104 can be formed by oxidation, nitridation, chemical vapor deposition (CVD), atomic layer deposition (ALD), pulsed CVD, plasma assisted CVD, sputtering, chemical solution deposition, etc. The gate dielectric layer 104 may have a thickness ranging from about 1 nm to about 10 nm, although a thickness less than 1 nm and greater than 10 nm have been contemplated. In one embodiment, the gate dielectric layer 104 may be about 1.0 to 2.0 nm thick.

The layered gate stack 102 may further include a conducting gate layer 106 overlying the gate dielectric layer 104. In various embodiments, conducting gate layer 106 may be, for example, doped polysilicon, metal, conducting metallic compound, or any suitable of those materials. In one embodiment, the conducting gate layer 106 can be formed by CVD, plating, sputtering, physical vapor deposition, etc. The conducting gate layer 106 may have a thickness ranging from about 10 nm to about 200 nm, although a thickness less than 10 nm and greater than 200 nm have been contemplated. In one embodiment, the gate dielectric layer 104 may be from about 40 nm to 80 nm thick. The conducting gate layer 106 can be doped with elements from group III-A or group V of the Periodic Table of Elements such as boron, phosphorus, arsenic. The dopants may be introduced during deposition of the conducting gate layer 106 or following subsequent formation of the gates 18. In some embodiments, the conducting gate layer 106 includes multiple layers to meet the requirement of device characteristics such as threshold voltage and gate conductance.

The layered gate stack 102 may further include a cap layer 108 overlying the conducting gate layer 106. In certain embodiments, cap layer 108 may be formed by depositing depositing silicon nitride using low-pressure chemical vapor deposition (LPCVD) to a thickness of from about 15 nm to about 80 nm, e.g., about 40 nm. The cap layer 108 may be utilized as a mask in gate 18 formation processes and may be patterned in accordance with desired locations of the gates 18. Using the cap layer 108 as a mask, an RIE may be used to remove portions of gate dielectric layer 104, conducting gate layer 106, and cap layer 108 outside each gate 18 footprint to define the gates 18.

In certain embodiments, the various layers of layered gate stack 102 may themselves include multiple layers. For example, gate dielectric layer 104 may be a single layer or more typically include multiple layers of materials. For example, gate dielectric layer 104 may include an interfacial layer (silicon oxide, silicon nitride, silicon oxynitride, etc.) and a high-k material with a dielectric constant greater than 7. Further, conducting gate layer 106 may include a polysilicon layer and a metal electrode layer formed atop the gate dielectric layer 104 utilizing a deposition process, such as CVD, plasma-assisted CVD, plating, and/or sputtering, followed by planarization. When a combination of conductive elements is employed, an optional diffusion barrier material such as tantalum nitride, titanium nitride, tungsten nitride may be formed between the conductive materials.

The semiconductor substrate 15 may include, but is not limited to: any semiconducting material such conventional Si-containing materials, Germanium-containing materials, GaAs, InAs and other like semiconductors. Si-containing materials include, but are not limited to: Si, bulk Si, single crystal Si, polycrystalline Si, SiGe, amorphous Si, silicon-on-insulator substrates (SOI), SiGe-on-insulator (SGOI), annealed poly Si, and poly Si line structures.

In various embodiments, substrate 15 may be, for example, a layered substrate 15a or a bulk substrate 15b. Layered substrate 15a may be as Si/SiGe, a silicon-on-insulator (SOI), or a SiGe-on-insulator (SGOI). When the semiconductor substrate 15 is SOI or SGOI substrate, the thickness of the Si-containing layer atop a buried insulating layer can have a thickness on the order of 30 nm or greater. Bulk semiconductor substrate 15b materials may include undoped Si, n-doped Si, p-doped Si, single crystal Si, polycrystalline Si, amorphous Si, Ge, SiGe, SiC, SiGeC, GaAs, InAs, InP, etc. A plurality of fins (not shown) may be etched from the substrate 15b.

When layered substrate 15a is utilized, it may include a base substrate, a dielectric layer formed on top of the base substrate, and a SOI layer formed on top of the buried dielectric layer. The buried dielectric layer a may isolate the SOI layer from the base substrate. The plurality of fins may be etched from the SOI layer. The base substrate may be made from any of several known semiconductor materials such as, for example, silicon, germanium, silicon-germanium alloy, silicon carbide, silicon-germanium carbide alloy, or other similar semiconductor materials. Non-limiting examples of compound semiconductor materials include gallium arsenide, indium arsenide, and indium phosphide. Typically the base substrate may be about, but is not limited to, several hundred microns thick. For example, the base substrate may have a thickness ranging from 0.5 mm to about 1.5 mm.

The buried dielectric layer may include any of several dielectric materials, for example, oxides, nitrides and oxynitrides of silicon. The buried dielectric layer may also include oxides, nitrides and oxynitrides of elements other than silicon. In addition, the buried dielectric layer may include crystalline or non-crystalline dielectric material. Moreover, the buried dielectric layer may be formed using any of several known methods, for example, thermal or plasma oxidation or nitridation methods, chemical vapor deposition methods, and physical vapor deposition methods. The buried dielectric layer may have a thickness ranging from about 5 nm to about 200 nm, though less and greater thicknesses have been contemplated. In one embodiment, the buried dielectric layer may have a thickness ranging from about 150 nm to about 70 nm.

The SOI layer may include any of the several semiconductor materials included in the base substrate. In general, the base substrate and the SOI layer may include either identical or different semiconducting materials with respect to chemical composition, dopant concentration and crystallographic orientation. The base substrate and the SOI layer may include semiconducting materials that have at least different crystallographic orientations. Typically, the SOI layer may include a thickness ranging from about 5 nm to about 100 nm, though less and greater thicknesses have been contemplated. In one embodiment, the SOI layer may have a thickness ranging from about 25 nm to about 30 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that the plurality of fins may be etched from the SOI layer and they may too include any of the characteristics listed above for the SOI layer.

An isolation region 14 may be formed in the semiconductor substrate 15, wherein the isolation region 14 separates a first portion of the semiconductor substrate 15 from a second portion of the semiconductor substrate 15, etc. The isolation region 14 may be a shallow trench isolation (STI). The STI regions may be formed by etching a trench in the semiconductor substrate 15 utilizing a conventional dry etching process, such as reactive-ion etching (RIE) or plasma etching. The trenches may optionally be lined with a conventional liner material, e.g., an oxide, and then chemical vapor deposition (CVD) or another like deposition process is used to fill the trench with polysilicon or another like STI dielectric material such as oxide and/or nitride. The STI dielectric may optionally be densified after deposition. A conventional planarization process, such as chemical-mechanical polishing (CMP), may optionally be used to provide a planar structure. In some embodiments, the isolation region is a LOCOS (Local Oxidation of Silicon) region formed by a conventional local oxidation of silicon.

Figure 3:
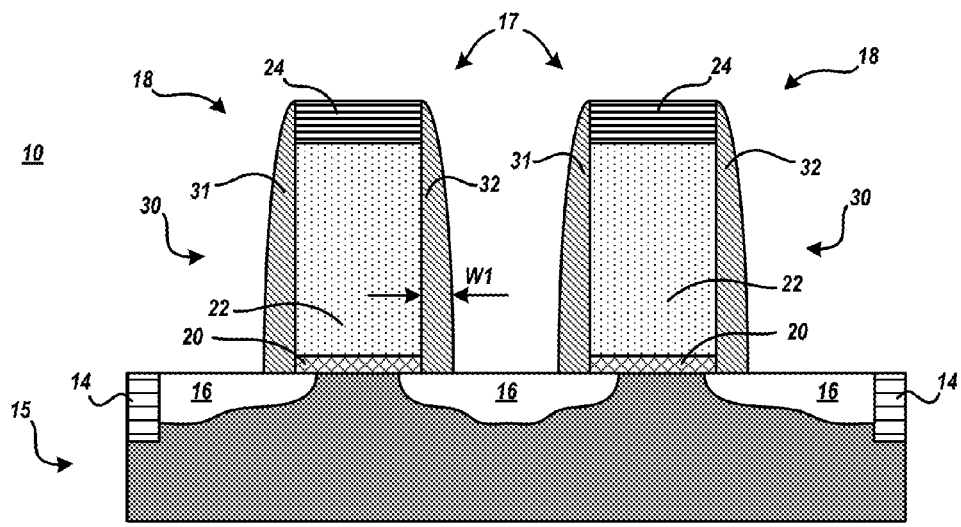

FIG. 3 depicts a cross section view of semiconductor structure 10 at an intermediate stage of semiconductor device fabrication, in accordance with various embodiments of the present invention. At this stage of semiconductor structure 10 fabrication, the gates 18, spacers 30, and substrate 15 active regions are formed.

A SAC gate 17 is a gate having a SAC self aligned thereto and may include a first gate 18 and a second gate 18. Gates 18 may be formed utilizing photolithography and etch process steps. Specifically, a pattern is produced by applying a masking layer such as a photoresist or photoresist with an underlying hardmask, to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. In one embodiment, cap layer 108 is etched and then utilized as an etch mask during the etch process that provides the gates 18. It is noted that the above-described etch process may be utilized to provide the gates 18, in the embodiments of the invention in which each gate 18 include dielectric 20 retained from gate dielectric layer 104, gate conductor 22 retained from conducting gate layer 106, and insulator cap 24 retained from cap layer 108.

Source and drain regions 16 of the semiconductor substrate 15 may be formed by ion implantation of n-type or p-type dopants into the semiconductor substrate 15. PFET devices are produced within Si-containing semiconductor substrates by doping the source and drain extension regions 16 with elements from group V of the Periodic Table of Elements, such as boron and/or antimony. NFET devices are produced within Si-containing semiconductor substrates by doping the source and drain extension regions 16 with elements from group V-A of the Periodic Table of Elements such as phosphorus, and/or arsenic. In one example, the dopant for the extension source and drain regions 16 includes arsenic (As), in which the arsenic is implanted at an energy ranging from 2 keV to 50 keV, and the implant concentration ranges from $5 \times 10^{13}$ atoms/cm2 to $1 \times 10^{15}$ atoms/cm2. Halo regions (not shown) can also be formed beneath the source and drain extension regions 16 using an angled ion implantation and a dopant having a conductivity type opposite the source and drain extension regions 16. Optionally, an extension offset spacer, which may include nitride and is not shown, may be formed before forming the extension source and drain regions 16. The extension offset spacer, when present, may be removed after forming the extension source and drain regions 16. In some embodiments, the source/drain is formed by in-situ doped epitaxy processes.

Spacers 30 may be formed on the sidewalls of the gates 18. The spacers 30 may include a first portion 31 formed upon a first gate 18 sidewall and a second portion 32 formed upon a second gate 18 sidewall of a similar gate 18. The spacer portions 31, 32 may be composed of a dielectric material, such as an oxide, nitride, oxynitride or combination thereof. Typically, the spacers 30 are composed of a nitride, such as silicon nitride. The spacers 30 may be provided by forming processes, such as deposition or thermal growth. For example, the first portions 31 and the second portions 32 may be formed by deposition processes, such as CVD in combination with an anisotropic etch, such as reactive ion etch. The first portion 31 and the second portion 32 may each have a width W1 that typically ranges from 3 nm to 30 nm, although lesser and greater thicknesses have been contemplated are employed in further embodiments. More typically, the first portion 31 and the second portion 32 may each have a width W1 that ranges from 5 nm to 10 nm.

Generally, gates 18, spacers 30, and structure 10 active regions (e.g. source drain regions 16) may be formed by other known or additional techniques than those described without deviating from the spirit of those embodiments herein claimed.

Figure 4:
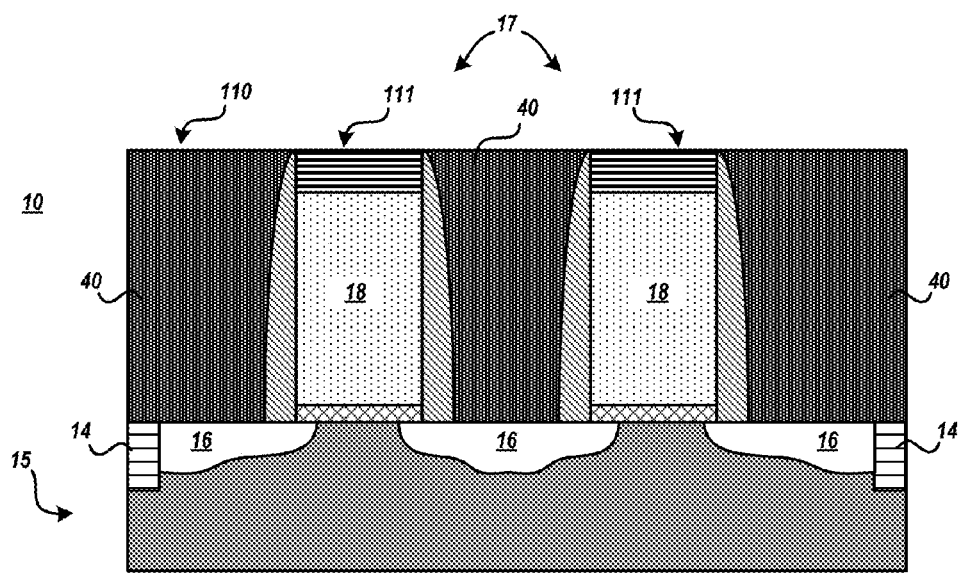

FIG. 4 depicts a cross section view of a semiconductor structure 10 at an intermediate stage of semiconductor device fabrication, in accordance with various embodiments of the present invention. At this stage of fabrication, interlayer dielectric 40 is formed upon structure 10. In various embodiments, interlayer dielectric 40 may be an oxide layer deposited upon structure 10. In particular embodiments, interlayer dielectric 40 may be deposited by e.g. CVD, ALD, PECVD, or other known formation techniques. The thickness of interlayer dielectric 40 may be from 10 nm to 500 nm, although lesser and greater thicknesses have been contemplated and are employed in further embodiments. In certain embodiments, interlayer dielectric 40 is deposited with a thickness sufficient to cover the gates 18. Interlayer dielectric 40 may be subsequently planarized to a top surface 111 of the gates 18 using CMP. In one embodiment, the CMP may use a ceria based slurry to recess the interlayer dielectric 40. The CMP technique may be designed to improve planarity of an upper surface 110 of interlayer dielectric 40 and one or more top surfaces 111 of the gates 18 (e.g. top surface of insulator cap 24, etc.) and may advantageously eliminate non planar surfaces of structure 10. The specific CMP technique may be chosen to effectively stop at the top surface 111 the gates 18. For example, the CMP technique may stop at the nitride material of insulator cap 24. Generally, interlayer dielectric 40 may be formed by other known or additional techniques than those described without deviating from the spirit of those embodiments herein claimed. In some embodiments, a liner such as nitride (not shown) may be formed upon structure 10 before the deposition of ILD oxide.

In some embodiments, the gate structures in FIG. 3 are dummy structures. Those dummy structures may be removed after ILD CMP and replaced with functional gate structures including a gate dielectric 20, a gate conductor 22, and a insulator cap 24. In other embodiments, the gate structures in FIG. 4 are formed by gate-first process and thus essentially the same as the structure shown in FIG. 3.

Figure 5:
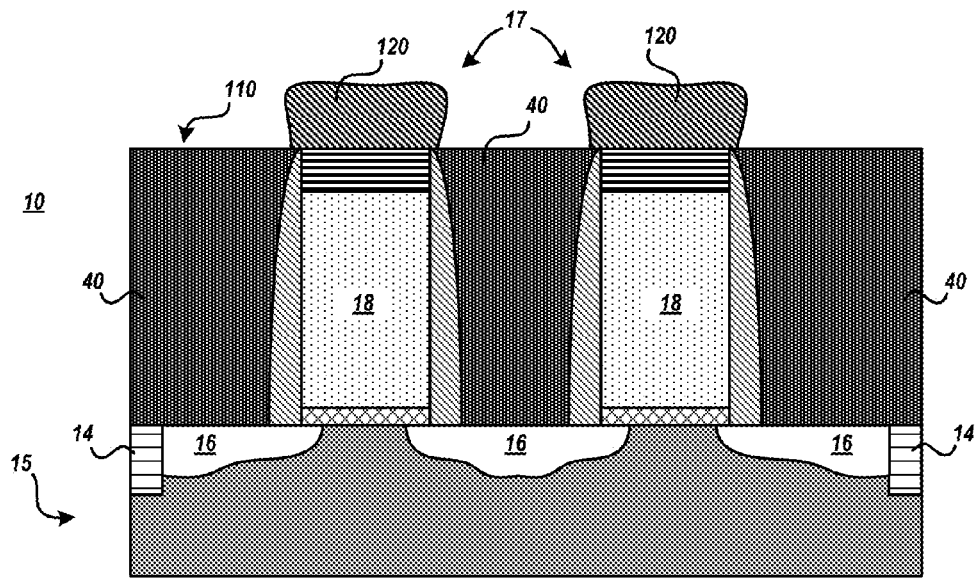

FIG. 5 depicts a cross section view of a semiconductor structure 10 at an intermediate stage of semiconductor device fabrication, in accordance with various embodiments of the present invention. At this stage of fabrication, sacrificial gate caps 120 are formed upon structure 10. In various embodiments, sacrificial gate caps 120 may be amorphous silicon (a-Si), amorphous silicon germanium (a-SiGe) and selectively deposited upon semiconductor structure 10. Unless described otherwise herein, selective depositing may include any now known or later developed techniques appropriate for the material of sacrificial gate caps 120 to be deposited generally upon gate 18 (e.g. insulator cap 24, etc.) and not generally deposited upon interlayer dielectric 40. In various embodiments of the present invention the materials of insulator cap 24, interlayer dielectric 40, and sacrificial gate caps 120 are chosen to provide for selective deposition. Such requirement may be satisfied by different combinations of material selections. Some of the combinations may include insulator cap 24 consisting of a nitride, interlayer dielectric 40 consisting of an oxide, and sacrificial gate caps 120 consisting of a-Si or a-SiGe since, for example, silicon may be deposited generally upon nitride and generally not upon oxide. In some embodiments, the sacrificial gate caps 120 may be wider than insulator gate cap 24 due to lateral growth. In some embodiments, sacrificial gate caps 120 may be sacrificial and replaced in subsequent operations. Generally, sacrificial gate caps 120 may be formed upon the gates 18 by other known or additional techniques than those described, (e.g. layer formation and subsequent etch, etc.) without deviating from the spirit of those embodiments herein claimed.

Figure 6:
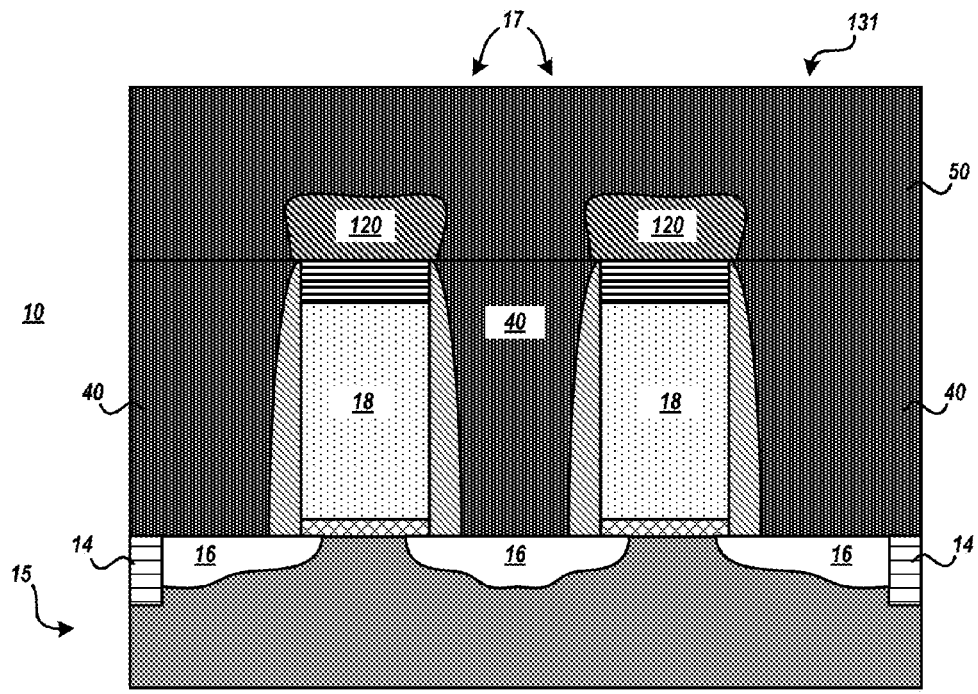

FIG. 6 depicts a cross section view of a semiconductor structure 10 at an intermediate stage of semiconductor device fabrication, in accordance with various embodiments of the present invention. At this stage of fabrication, interlayer dielectric 50 is formed upon structure 10. In various embodiments, interlayer dielectric 50 may be an oxide layer deposited upon internal layer dielectric 40 and sacrificial gate caps 120. In particular embodiments, interlayer dielectric 50 may be deposited by e.g. CVD, ALD, PECVD, or other known formation techniques. The thickness of interlayer dielectric 50 may be from 10 nm to 500 nm, although lesser and greater thicknesses have been contemplated and are employed in further embodiments. In certain embodiments, interlayer dielectric 50 may be subsequently planarized using CMP to improve planarity of an upper surface 131 and may advantageously eliminate non planar surfaces of structure 10. Generally, interlayer dielectric 50 may be formed by other known or additional techniques than those described without deviating from the spirit of those embodiments herein claimed.

Figure 7:
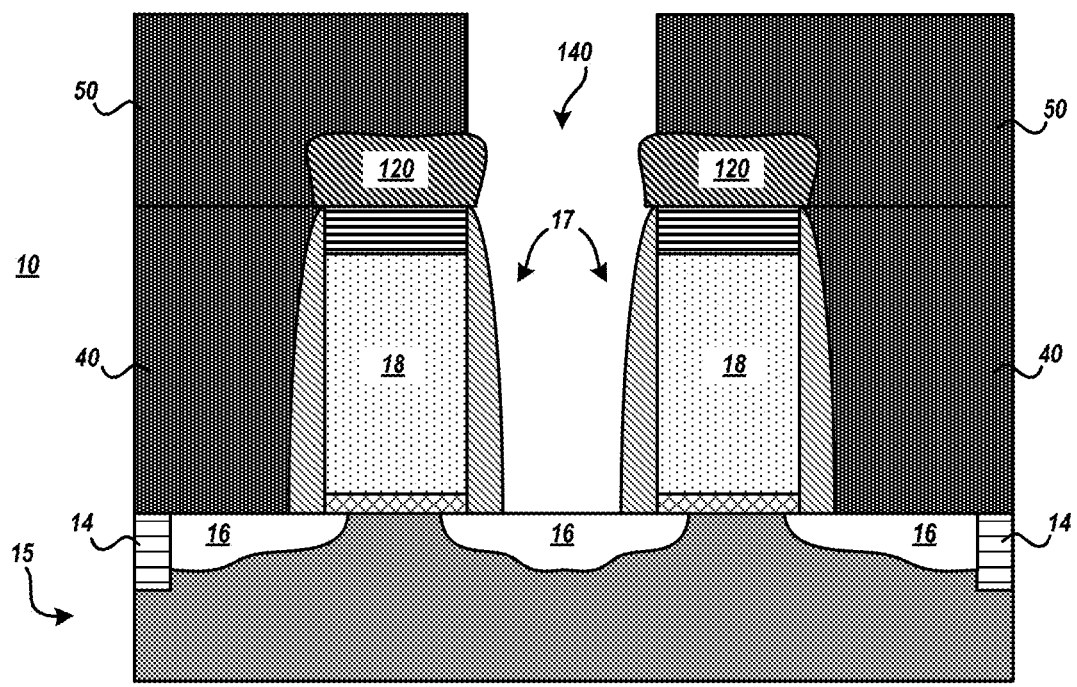

FIG. 7 depicts a cross section view of a semiconductor structure 10 at an intermediate stage of semiconductor device fabrication, in accordance with various embodiments of the present invention. At this stage of fabrication, SAC trenches 140 are formed upon structure 10.

A SAC trench 140 may be formed through interlayer dielectric 50 and interlayer dielectric 40 self aligned to SAC gate 17. The SAC trenches 140 expose an active region (e.g. source drain region 16, etc.) of substrate 15 to allow electrical connection thereto. In subsequent fabrication steps, a conductor may be deposited in SAC trenches 140 to make such electrical connections. The SAC trenches 140 are self-aligned in that they are formed through interlayer dielectric 50 and interlayer dielectric 40 using an etch process that is selective to the spacers 30 and sacrificial gate caps 120. That is, the etch process used to form the SAC trenches 140 may not appreciably remove the spacers 30 and sacrificial gate caps 120, thereby making the alignment of the mask for the etch process less critical. In one embodiment, the SAC trenches 140 are formed through the interlayer dielectric 50 and interlayer dielectric 40 using a multiple-step etch process. The first etch step may comprise an oxide etch with high selectivity to the material of sacrificial gate caps 120 in order to remove interlayer dielectric 50 material and retain sacrificial gate caps 120. The second etch step may comprise an oxide etch with high selectivity to the material of spacers 30 in order to remove interlayer dielectric 40 material and retain spacers 30.

As such, in certain embodiments, the material of sacrificial gate caps 120 and/or spacers 30 may be selected as to have differing etch properties in relation to the material interlayer dielectric 40 and/or interlayer dielectric 50. It may be desirable that for certain selective etches the material of interlayer dielectric 40 and/or interlayer dielectric 50 etches at a faster rate than the sacrificial gate caps 120 and/or spacers 30 material. Such requirements may be satisfied in embodiments of the invention by several different combinations of material selections. For example, the sacrificial gate cap 120 may be amorphous silicon and ILD 40 and/or ILD 50 may be oxide. A high selectivity, e.g., greater than 5:1, can be achieved by etching ILD oxide selective to amorphous silicon. Thus, the insulator cap 24 as, e.g. silicon nitride may be protected by the amorphous silicon during SAC trench RIE.

Figure 8:
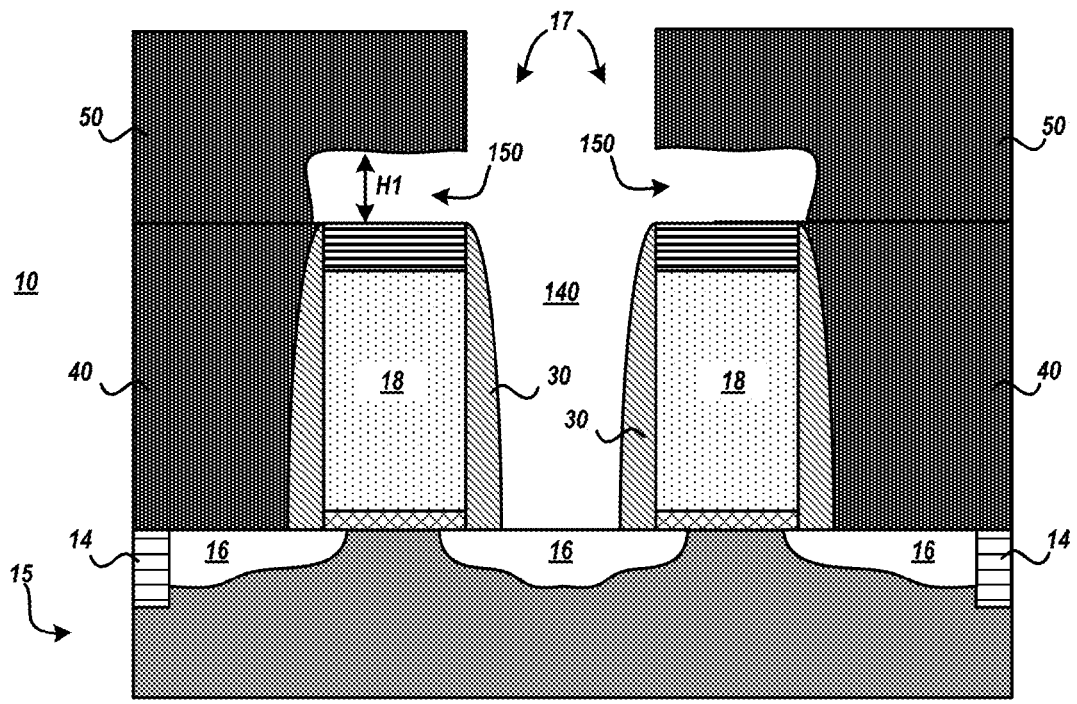

FIG. 8 depicts a cross section view of a semiconductor structure 10 at an intermediate stage of semiconductor device fabrication, in accordance with various embodiments of the present invention. At this stage of fabrication, sacrificial gate caps 120 are removed from structure 10. In various embodiments, sacrificial gate caps 120 may be selectively removed from semiconductor structure 10. Unless described otherwise herein, selective removal of sacrificial gate caps 120 may include any now known or later developed techniques that allow for the material of sacrificial gate caps 120 to be removed whilst retaining the material of other structure 10 components such as interlayer dielectric 40, interlayer dielectric 50, first and second gates 18, substrate 15, etc. The selective removal of sacrificial gate caps 120 may be accomplished via, for example, a selective etch process or processes utilizing an enchant chosen to remove the material of sacrificial gate caps 120 to be removed whilst retaining the material of other structure 10 components such as interlayer dielectric 40, interlayer dielectric 50, first and second gates 18, substrate 15, etc. For example, if the material of sacrificial gate caps 120 is a-SiGe, if the material of interlayer dielectric 40, interlayer dielectric 50, and spacers 30 is an oxide, if the material of gate insulator cap 24 is nitride, then a hydrogen peroxide or a hydrogen chloride based enchant may be utilized to remove sacrificial gate caps 120 whilst retaining the material of other structure 10 components. In various embodiments, upon the removal of sacrificial gate caps 120 a cavity 150 is formed within interlayer dielectric 50 above first and second gates 18. Cavities 150 are exposed to SAC trench 140 and each have a height H1 that may range from 10 nm to 30 nm, although lesser and greater thicknesses have been contemplated are employed in further embodiments. More preferably, cavities 150 may each have a height H1 that is approximately 15 nm. Generally, sacrificial gate caps 120 may be selectively removed by other known or additional techniques than those described without deviating from the spirit of those embodiments herein claimed.

In certain embodiments, SAC trenches 140 are defined by sidewalls consisting of sidewall portions of interlayer dielectric 50, gate 18 (i.e. spacers 30, etc.), and cavities 150. Generally, SAC trenches 140 may be formed by other known or additional techniques than those described without deviating from the spirit of those embodiments herein claimed.

Figure 9:
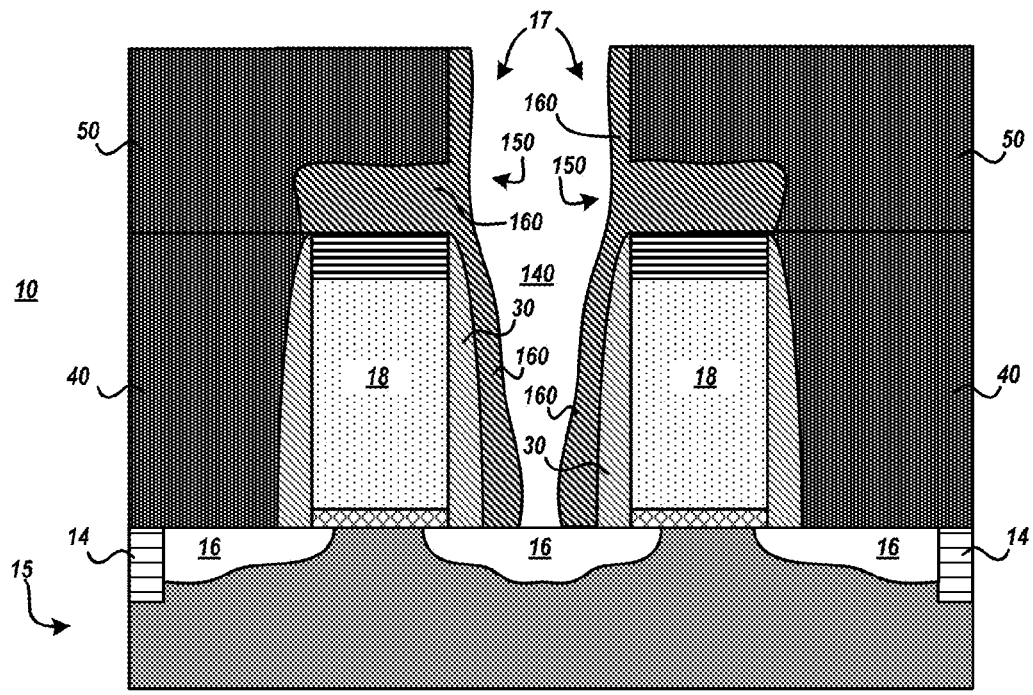

FIG. 9 depicts a cross section view of a semiconductor structure 10 at an intermediate stage of semiconductor device fabrication, in accordance with various embodiments of the present invention. At this stage of fabrication, low-k material 160 is deposited upon structure 10. In various embodiments, low-k material 160 may be formed upon SAC trench 140 sidewalls and within cavities 150. In some embodiments, the low-k material 160 within cavities 150 may take the geometry of cavity 150 and therefore may formed wider than insulator cap 24 generally upon gates 18.

Low-k material 160 may be a dielectric having a dielectric constant less than the dielectric constant of silicon dioxide, such as carbon containing silicon materials such as silicon oxycarbides (SiOC) or silicon carbides, silicon nitrides (SiN) or carbon containing silicon nitride materials (SiCN), and/or boron nitride (BN), silicon boron nitride (SiBN), silicon boron carbide nitride (SiBCN), carbon doped silicon oxide, fluorine doped oxide, porous dielectric, or combinations thereof. The low-k material 160 may be of any desirable thickness and may include one or more dielectric layers. In various embodiments, low-k material 160 may be deposited with a conformal deposition technique to a thickness that is approximately equal to half the height H1 of cavities 150. For instance, if H1 is 15 nm, low-k material 160 may be deposited forming an 8 nm layer upon the one or more SAC trench 140 sidewalls, etc. to allow that low-k material 160 fills cavities 150. Generally, low-k material 160 may formed by other known or additional techniques than those described without deviating from the spirit of those embodiments herein claimed.

Figure 11:
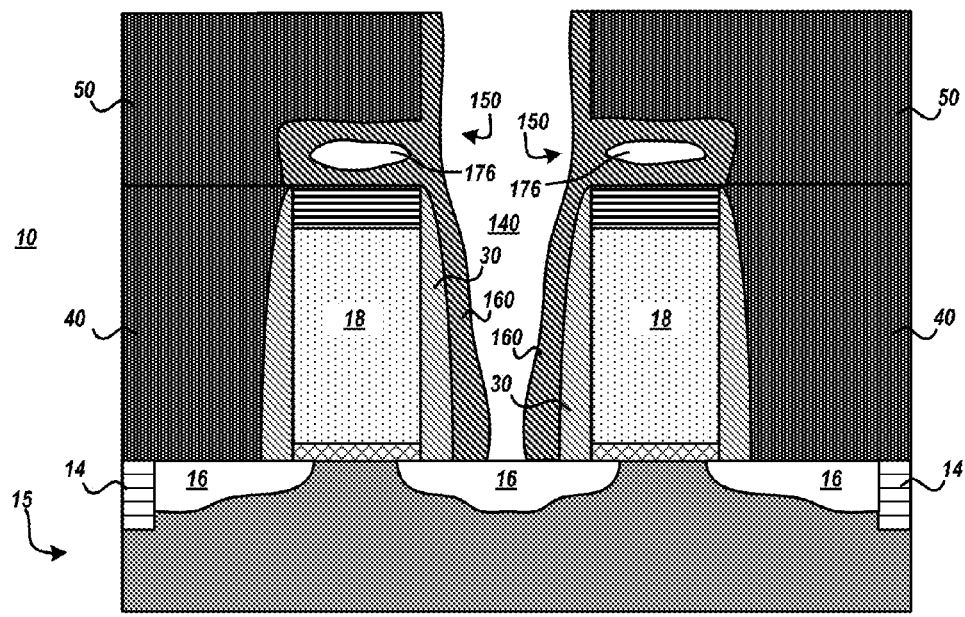

In certain embodiments, as shown in FIG. 11, low-k material 160 may be deposited to partially fill cavities 150 resulting in an inner pocket 176 surrounded by low-k material 160 within cavity 150. Pocket 176 is the absence of a solid (e.g. air pocket, etc.) and may be formed by stopping the deposit of low-k material 160 when material 160 meets and pinches off within the opening of cavity 150 exposed to SAC trench 140. In certain embodiments, one or more pockets 176 may be formed within a particular cavity 150.

Figure 10:
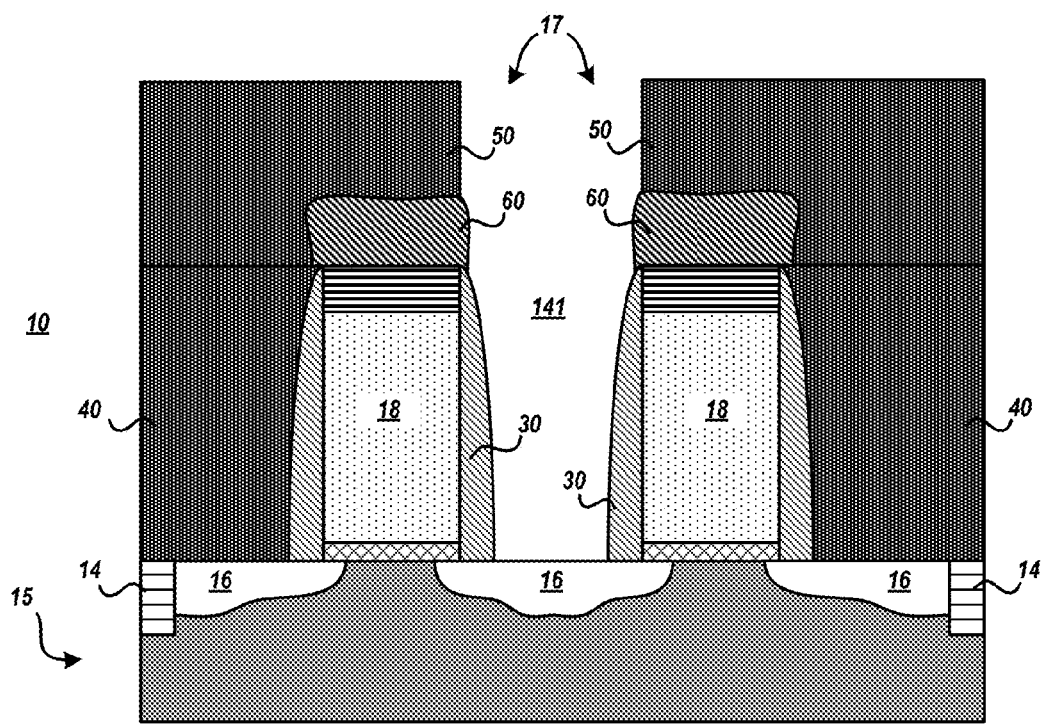

FIG. 10 depicts a cross section view of a semiconductor structure 10 at an intermediate stage of semiconductor device fabrication, in accordance with various embodiments of the present invention. At this stage of fabrication, SAC trenches 141 and low-k gate caps 60 are formed upon structure 10. A SAC trench 141 may be formed by removing low-k material 160 generally outside of cavity 150. The SAC trenches 141 expose an active region (e.g. source drain region 16, etc.) of substrate 15 to allow electrical connection thereto. In subsequent fabrication steps, a conductor may be deposited in SAC trenches 141 to make such electrical connections.

An etch process may be used to form SAC trenches 141 by removing the low-k material 160 growth that occurred generally outside of cavity 150 and retaining the low-k gate cap 60 within cavity 150. For example, if the low-k material 160 was formed to a 8 nm thickness, a 10 nm etch process may be utilized to remove the low-k material 160 from SAC trench 140 bottom and sidewalls, spacer 30 sidewalls, etc. while retaining the low-k material 160 generally within cavity 150.

In various embodiments, the low-k gate caps 60 may be formed by retaining the low-k material 160 within cavities 150. Therefore, low-k gate caps 60 may take on the properties of low-k material 160. In some embodiments, low-k gate caps 60 may be wider than insulator caps 24. In certain embodiments, SAC trenches 141 are defined by sidewall portions of interlayer dielectric 50, low-k gate cap 60/175, and first and second gates 18 (i.e. spacers 30, etc.).

Generally, SAC trenches 141 and low-k gate cap 60 may be formed by other known or additional techniques than those described without deviating from the spirit of those embodiments herein claimed.

Figure 12:
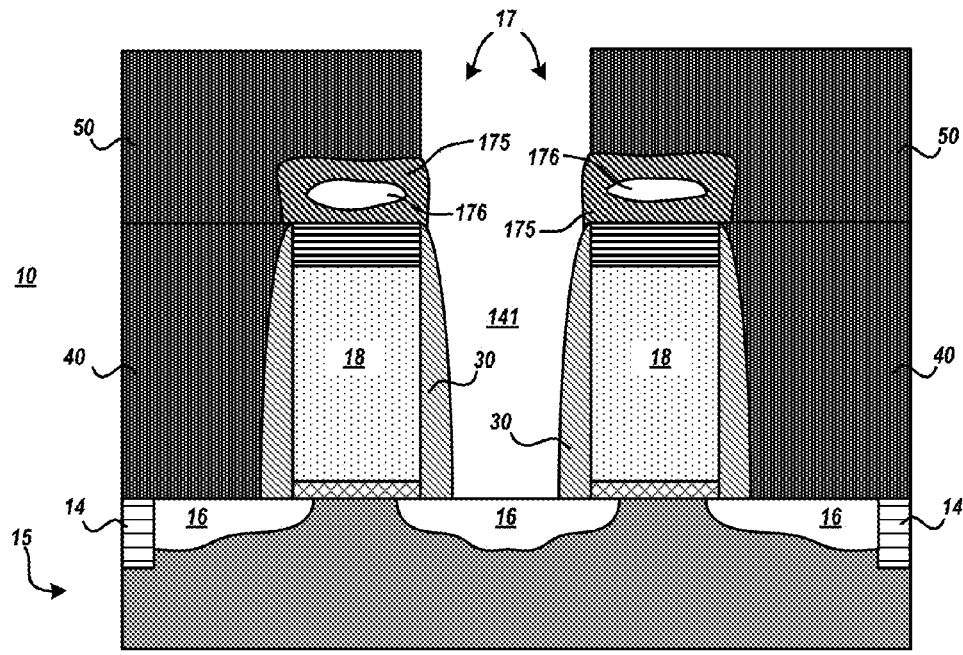

In certain embodiments, as shown in FIG. 12, low-k material 160 outside of cavity 150 may be removed with retaining a low-k gate cap 175 comprising pocket 176 within cavity 150. As such, the low-k gate caps 176 may be formed by retaining the low-k material 160 and pocket 176 within cavities 150. Therefore, low-k gate caps 176 may have a lower dielectric constant k compared to gate caps 60 due to pockets 176. In some embodiments, low-k gate caps 175 may be wider than insulator caps 24. Generally, low-k gate cap 175 comprising one or more pockets 176 may be formed by other known or additional techniques than those described without deviating from the spirit of those embodiments herein claimed.

Figure 13:
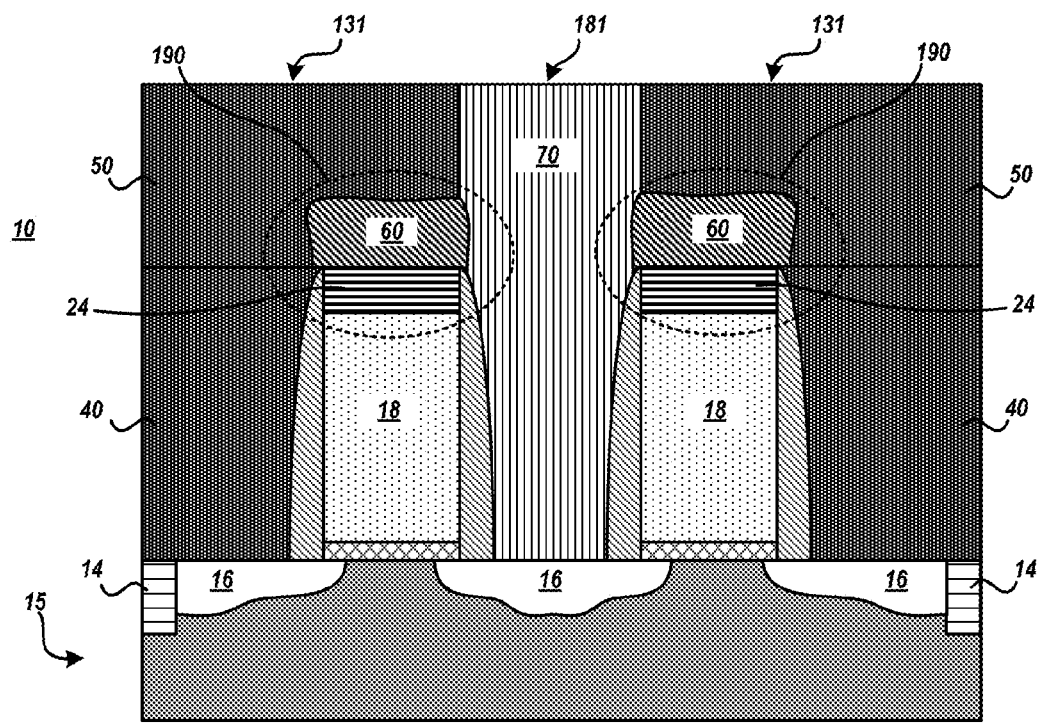
Figure 14:
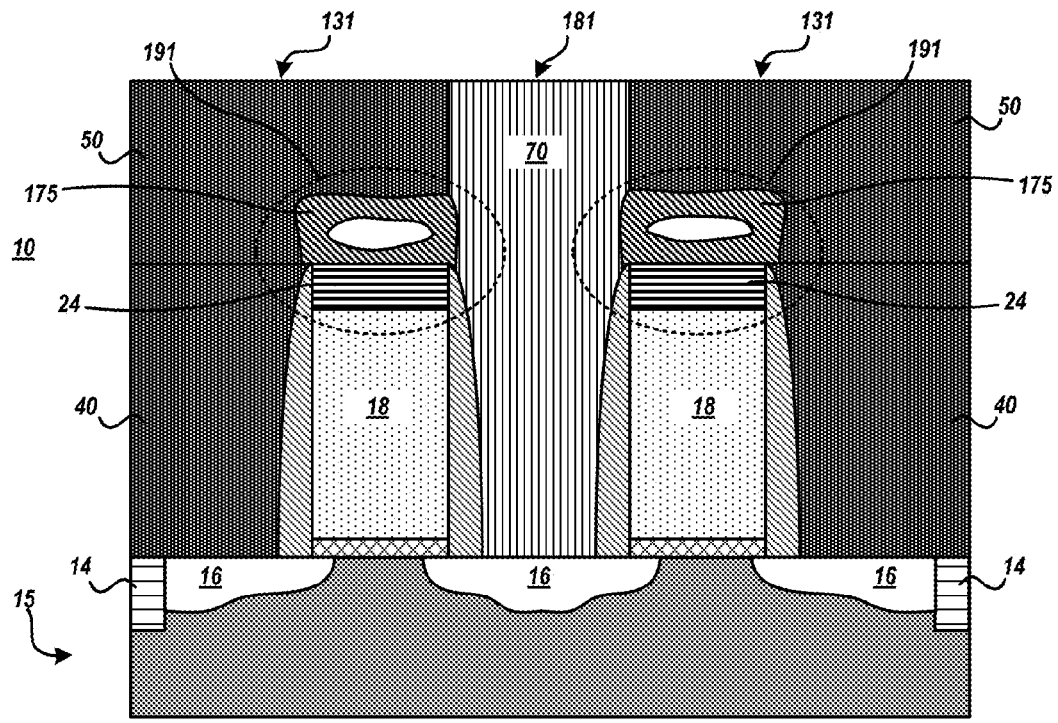

FIG. 13 and FIG. 14 depict a cross section view of a semiconductor structure 10 at an intermediate stage of semiconductor device fabrication, in accordance with various embodiments of the present invention. At this stage of fabrication, SAC 70 is formed by filling SAC trenches 141 with conductive material (e.g., a metal, a metal-containing material, a material comprising a metal) forming SAC 70. The SAC 70 provides an electrical connection of the active region (e.g. source drain region 16, etc.) of substrate 15 to other semiconductor structure 10 component formed above and contacting SAC 70, for example, in subsequent Front End of the Line, Middle End of the Line, etc. fabrication steps. In certain embodiments, after filling trench 141 with electrically conductive material, structure 10 to planarize upper surface 131 of interlayer dielectric 50 and an upper surface 181 of SAC 70. In some embodiment, the SAC trench 141 is filled with conducting materials by first depositing a liner material such as titanium nitride followed by filling the remaining trench with tungsten. In some embodiments, a silicide (not shown) may be formed upon S/D region 16 associated with SAC trench 141 prior to filling the SAC trench 141.

As shown in FIG. 13, semiconductor structure 10 may include a multi-layer gate cap 190 comprising low-k gate cap 60 formed upon insulator cap 24 to electrically isolate SAC 70 and source drain region 16 from gate conductor 22. The multi-layer gate cap 190 advantageously reduces the parasitic capacitance that adversely impacts device performance and power consumption. Further in other embodiments, as shown in FIG. 14, semiconductor structure 10 may include multi-layer gate cap 191 comprising low-k gate cap 176 that includes one or more pockets 176 formed upon insulator cap 24 to electrically isolate SAC 70 and source drain region 16 from gate conductor 22. The multi-layer gate cap 191 may further advantageously reduce the parasitic capacitance that adversely impacts device performance and power consumption.

Figure 15:
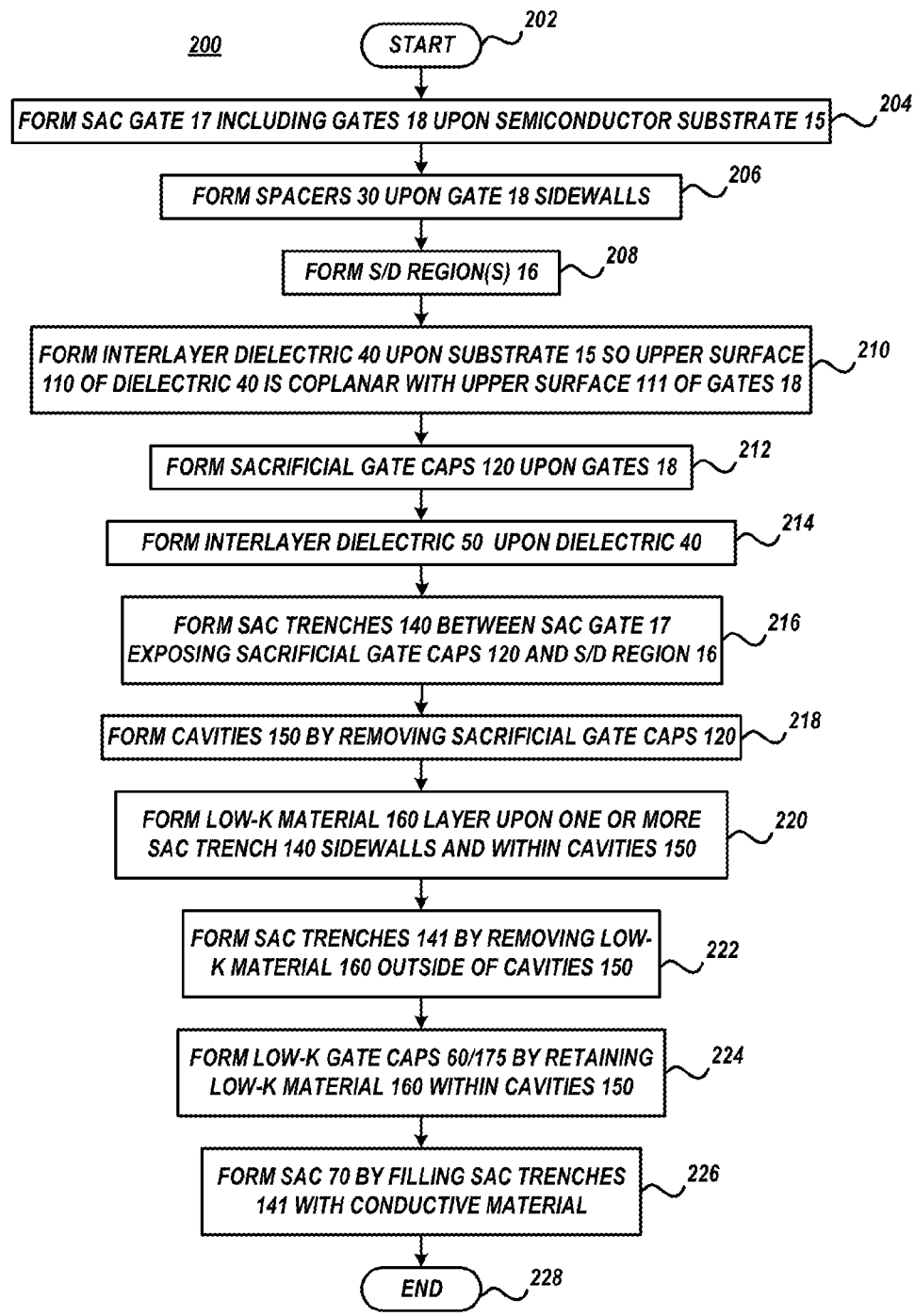
FIG. 15 depicts an exemplary semiconductor device fabrication process flow method, in accordance with various embodiments of the present invention.

FIG. 15 depicts an exemplary process flow method 200 for manufacturing a semiconductor device with low-k gate cap and self-aligned contact, in accordance with various embodiments of the present invention. Method 200 begins at block 202 and continues by forming at least one SAC gate 17 upon semiconductor structure 10 that includes at least a semiconductor substrate 15 (block 204). For example, a first gate 18 and second gate 18 may be formed upon a layered substrate 15a or a bulk substrate 15b of semiconductor structure 10. Method 200 may continue with forming spacers 30 upon gate 18 sidewalls (block 206). For example, a first spacer portion 31 may be formed upon a first gate 18 sidewall and a second spacer portion 32 may be formed upon a second sidewall of gate 18. In certain embodiments, the spacers 30 may be etched to a desired shape. Method 200 may continue with forming source drain regions 16 within substrate 15 (block 208). An exemplary depiction of semiconductor structure 10 subsequent to block 204, block 206, and block 208 processes or techniques is shown in FIG. 3.

Method 200 may continue with forming interlayer dielectric 40 upon structure 10 (block 210). For example, interlayer dielectric 40 may be formed upon substrate 15 generally surrounding SAC gate 17. In certain embodiments, interlayer dielectric 40 may be formed to a thickness greater than the height of first and second gates 18 and reduced to be coplanar with the first and second gates 18. For example, a CMP technique may be utilized to planarize the top surface 110 of interlayer dielectric 40 with an upper surface 111 of first and second gates 18. An exemplary depiction of semiconductor structure 10 subsequent to block 210 processes or techniques is shown in FIG. 4.

Method 200 may continue with forming sacrificial gate caps 120 upon first and second gates 18 (block 212). For example, a first sacrificial gate cap 120 may be formed upon at a first gate 18 and a second sacrificial gate cap 120 may be formed upon the other gate 18. In certain embodiments, the width of sacrificial gate caps 120 may be slightly wider than the width of first and second gates 18. In other embodiments, the width of sacrificial gate caps 120 may be slightly narrower than the width of first and second gates 18. Still in other embodiments, the width of sacrificial gate caps 120 may be generally equal to the width of insulator cap 24. An exemplary depiction of semiconductor structure 10 subsequent to block 212 processes or techniques is shown both in FIG. 5.

Method 200 may continue with forming interlayer dielectric 50 upon interlayer dielectric 40 (block 214). For example, interlayer dielectric 50 may be deposited to a thickness greater than the height of sacrificial gate caps 120 so that interlayer dielectric 50 generally surrounds sacrificial gate caps 120. In certain embodiments, a CMP technique may be utilized to planarize an upper surface 131 of interlayer dielectric 50. An exemplary depiction of semiconductor structure 10 subsequent to block 214 processes or techniques is shown in FIG. 6.

Method 200 may continue with forming SAC trenches 140 between gate 17 to expose an inner portion of sacrificial gate cap 120 and source drain region 16 (block 216). For example, SAC trenches 140 are formed by removing interlayer dielectric material 50 and interlayer dielectric material 40 between gate 17 to expose inner sidewalls of first and second gates 18 (i.e. spacers 30, etc.), inner portions of sacrificial gate cap 120, and substrate 15. The width of SAC trenches 140 within the interlayer dielectric 50 area may be slightly wider than the width separating gate 17. An exemplary depiction of semiconductor structure 10 subsequent to block 216 processes or techniques is shown both in FIG. 7.

Method 200 may continue with forming cavities 150 by removing sacrificial gate caps 120 (block 218). For example, an etch processes may selectively remove sacrificial gate caps 120. In certain embodiments, cavities 150 may have a height H1 greater than a thickness of gate insulator cap 24. In certain embodiments, H1 may be less than the thickness of insulator caps 24 or generally equal to the thickness of insulator caps 24. An exemplary depiction of semiconductor structure 10 subsequent to block 218 processes or techniques is shown in FIG. 8.

Method 200 may continue with forming low-k material 160 layer upon one or more SAC trench 140 sidewalls and within cavities 150 (block 220). In certain embodiments, the low-k material 160 layer has a thickness greater than half the height H1 of cavities 150. In certain embodiments, low-k material 160 completely fills cavities 150. In other embodiments, low-k material 160 only partially fills cavities 150 thereby forming one or more pockets 176. An exemplary depiction of semiconductor structure 10 subsequent to block 220 processes or techniques is shown in FIG. 9 or FIG. 11.

Method 200 may continue with forming SAC trenches 141 by removing low-k material 160 generally not within cavities 150 (block 222). For example an etch process may remove low-k material on the sidewalls of SAC trench 140 associated with interlayer dielectric 50 and associated with first and second gates 18 (i.e. spacers 30, etc.). Method 200 may continue with forming low-k gate caps 60, 175 by retaining the low-k material formed within cavities 150 (block 224). An exemplary depiction of semiconductor structure 10 subsequent to block 224 processes or techniques is shown in FIG. 12. In certain embodiments, the formation of low-k gate caps 60, 175 creates multi-layered gate caps 190, 191 comprising the low-k gate caps 60, 175 upon insulator cap 24. An exemplary depiction of semiconductor structure 10 subsequent to block 222 and 224 processes or techniques is shown in FIG. 10 or FIG. 12. Method 200 may continue with forming SAC 70 by filling SAC trenches 141 with conductive material (block 226). An exemplary depiction of semiconductor structure 10 subsequent to block 226 processes or techniques is shown in FIG. 13 or FIG. 14.

In certain embodiments, method 200 may continue with further semiconductor fabrication techniques that may add or remove components, materials, etc. in further front end of line, middle end of line, or back end of line fabrication steps to form a semiconductor device. Method 200 ends at block 228.

Figure 16:
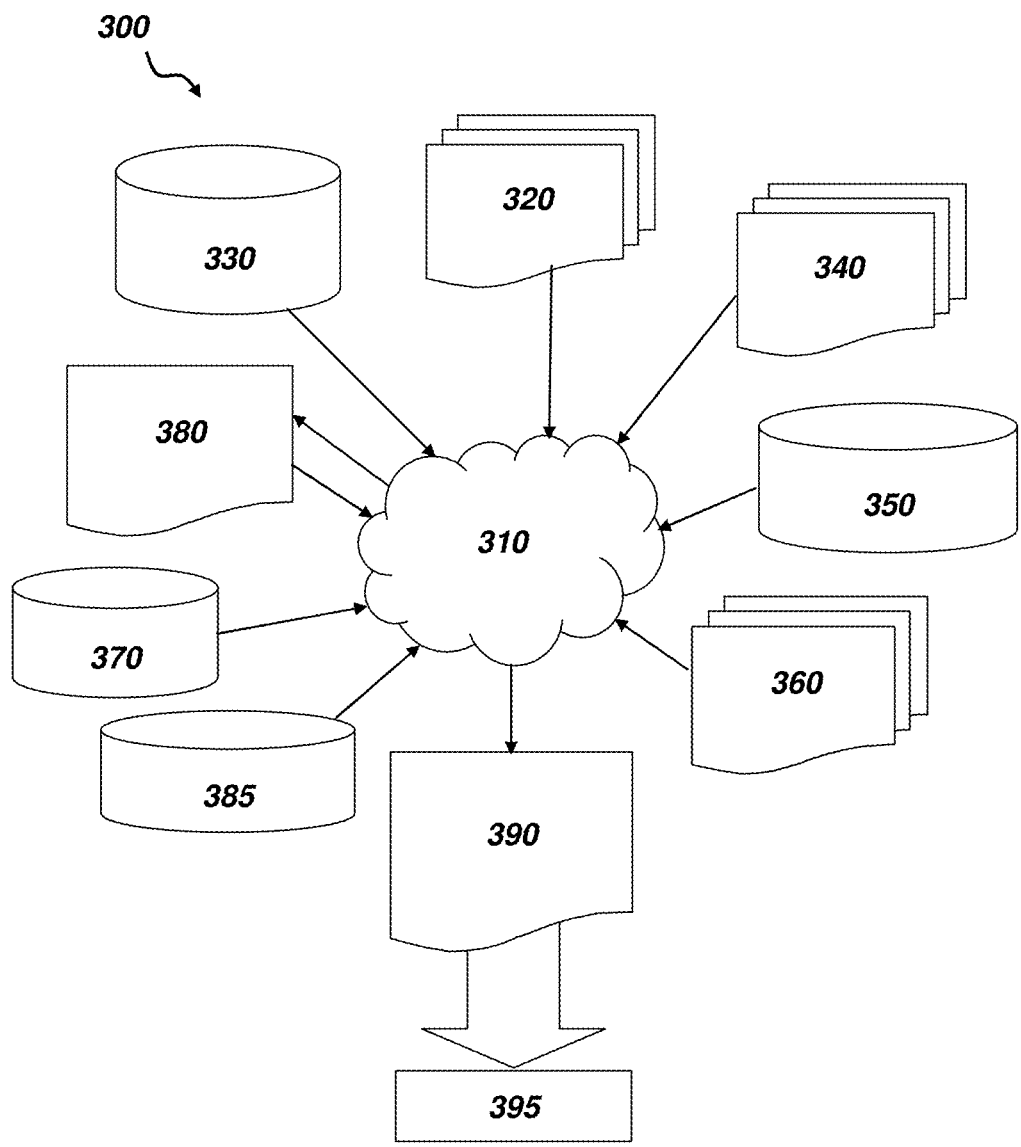
FIG. 16 depicts a flow diagram of a design process used in semiconductor design, manufacture, and/or test, in accordance with various embodiments of the present invention.

Referring now to FIG. 16, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIGS. 1-14.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 19 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIGS. 1-14. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIGS. 1-14 to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-14. In one embodiment, design structure 390 may comprise a compiled, executable HDL simulation model that functionally simulates the devices shown in FIGS. 1-14.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-14. Design structure 390 may then proceed to a stage 395 where, for example, design structure 390: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

Unless described otherwise or in addition to that described herein, "depositing" may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation. Any references to "poly" or "poly silicon" should be understood to refer to polycrystalline silicon.

References herein to terms such as "vertical", "horizontal", etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A semiconductor device fabrication process comprising:
   forming at least one gate upon a semiconductor substrate;
   forming a first gate cap upon the gate;
   forming a first interlayer dielectric layer upon the semiconductor substrate so that an upper surface of the first interlayer dielectric layer is coplanar with an upper surface of the first gate cap;
   forming a sacrificial gate cap upon the first gate cap;
   forming a second interlayer dielectric layer upon the first interlayer dielectric layer surrounding the sacrificial gate cap;
   forming a contact trench self aligned to the gate;
   forming a self-aligned contact by filling the contact trench with electrically conductive material, and;
   subsequent to forming the self aligned contact trench and prior to forming the self-aligned contact, forming a low-k gate cap upon the first gate cap, wherein the low-k gate cap is formed from a low-k material comprising a dielectric constant less than seven.

2. The semiconductor device fabrication process of claim 1, further comprising:
   subsequent to forming the self aligned contact trench and prior to forming the self-aligned contact, forming a cavity within the contact trench by removing the sacrificial gate cap.

3. The semiconductor device fabrication process of claim 2, further comprising:
   prior to forming the self-aligned contact, forming the low-k material upon sidewalls of the contact trench and within the cavity.

4. The semiconductor device fabrication process of claim 3, further comprising:
   removing the low-k material generally formed outside of the cavity.

5. The semiconductor device fabrication process of claim 4, wherein the first gate cap and the low-k gate cap form a multilayered gate cap that electrically isolates the gate from the self-aligned contact.

* * * * *